(12) United States Patent
Li et al.

(10) Patent No.: US 9,088,296 B2
(45) Date of Patent: Jul. 21, 2015

(54) VARIABLE LENGTH CODING AND DECODING USING COUNTERS

(75) Inventors: Bin Li, Hefei (CN); Jizheng Xu, Beijing (CN)

(73) Assignee: Microsoft Technology Licensing, LLC, Redmond, WA (US)

( * ) Notice: Subject to any disclaimer, the term of this patent is extended or adjusted under 35 U.S.C. 154(b) by 763 days.

(21) Appl. No.: 13/339,913

(22) Filed: Dec. 29, 2011

(65) Prior Publication Data

US 2013/0170556 A1 Jul. 4, 2013

(51) Int. Cl.
| H04N 7/26 | (2006.01) |
| H04N 7/40 | (2006.01) |
| H03M 7/40 | (2006.01) |
| H03M 7/30 | (2006.01) |
| H04N 19/61 | (2014.01) |
| H04N 19/91 | (2014.01) |

(52) U.S. Cl.
CPC .............. *H03M 7/40* (2013.01); *H03M 7/6088* (2013.01); *H04N 19/61* (2014.11); *H04N 19/91* (2014.11)

(58) Field of Classification Search
CPC ........................... H03M 7/40; H04N 19/00951
See application file for complete search history.

(56) References Cited

U.S. PATENT DOCUMENTS

| 5,528,628 | A * | 6/1996 | Park et al. ...................... 375/240 |
| 5,818,529 | A | 10/1998 | Asamura et al. |
| 6,198,848 | B1 | 3/2001 | Honma et al. |
| 6,449,394 | B1 | 9/2002 | Florencio |
| 6,696,993 | B2 * | 2/2004 | Karczewicz ..................... 341/67 |
| 7,139,435 | B2 * | 11/2006 | Malvar ........................... 382/245 |
| 7,304,942 | B1 | 12/2007 | Malladi et al. |

OTHER PUBLICATIONS

Chen et al., "CE5: Improved coding of inter prediction mode with LCEC," JCT-VC of ITU-T SG16 WP3 and ISO/IEC JTC1/SC29/WG11, Document JCTVC-D370, 4$^{th}$ Meeting: Daegu, KR, Jan. 20-28, 2011, 2 pages.
Guo et al., "CE5: Counter based adaption for LCEC," JCT-VC of ITU-T SG16 WP3 and ISO/IEC JTC1/SC29/WG11, Document JCTVC-E143, 5$^{th}$ Meeting: Geneva, CH, Mar. 16-23, 2011, 8 pages.
Li et al., "Adaptive coding order for skip and split flags in LCEC," JCT-VC of ITU-T SG16 WP3 and ISO/IEC JTC1/SC29/WG11, Document JCTVC-D140, 4$^{th}$ Meeting: Daegu, KR, Jan. 20-28, 2011, 4 pages.

(Continued)

*Primary Examiner* — Andy Rao
*Assistant Examiner* — Tyler Edwards
(74) *Attorney, Agent, or Firm* — Miia Sula; Judy Yee; Micky Minhas

(57) ABSTRACT

Disclosed herein are representative embodiments for performing entropy coding or decoding using a counter-based scheme. In one exemplary embodiment disclosed herein, a first codeword is received from compressed digital media data. The first codeword is decoded into a first digital media data value by referencing a codeword table that associates the first codeword with the first digital media data value and a second codeword with a second digital media data value. A counter for counting occurrences of the first digital media data value is incremented. The value of the first counter is compared with the value of a second counter that counts occurrences of a second digital media data value. If the value of the first counter and the value of the second counter are equal (or greater than or equal), the codeword table is updated to swap codewords between the first and second digital media values.

20 Claims, 11 Drawing Sheets

(56) References Cited

OTHER PUBLICATIONS

Sullivan et al., "Meeting report of the fourth meeting of the Joint Collaborative Team on Video Coding (JCT-VC)," Document JCTVC-D500, 4$^{th}$ Meeting: Daegu, KR, Jan. 20-28, 2011, 173 pages.
Tian et al., "Review of CAVLC, Arithmetic Coding, and CABAC," *Proceedings: Entropy Coders of the H.264/AVC Standard, Signals and 29 Communication Technology*, pp. 29-39, Published 2011.

\* cited by examiner

| Index | Code Word | Symbol |
|---|---|---|
| 1 | 1 | Symbol A |
| 2 | 01 | Symbol B |
| 3 | 001 | Symbol C |
| 4 | 0001 | Symbol D |

| Index | Counter Value |
|---|---|
| 1 | 25 |
| 2 | 10 |
| 3 | 10 |
| 4 | 9 |

FIG. 4

| Index | Code Word | Symbol |
|---|---|---|
| 1 | 1 | Symbol A |
| 2 | 01 | Symbol B |
| 3 | 001 | Symbol C |
| 4 | 0001 | Symbol D |

| Index | Counter Value |
|---|---|
| 1 | 25 |
| 2 | 10 |
| 3 | 10 |
| 4 | 10 |

FIG. 5

| Index | Code Word | Symbol |
|---|---|---|
| 1 | 1 | Symbol A |
| 2 | 01 | Symbol B |
| 3 | 001 | Symbol D |
| 4 | 0001 | Symbol C |

| Index | Counter Value |
|---|---|
| 1 | 25 |
| 2 | 10 |
| 3 | 10 |
| 4 | 10 |

| Index | Code Word | Symbol |
|---|---|---|
| 1 | 1 | Symbol A |
| 2 | 01 | Symbol B |
| 3 | 001 | Symbol C |
| 4 | 0001 | Symbol D |

820 ↓822 ↓824

| Index | Counter Value |
|---|---|
| 1 | 25 |
| 2 | 10 |
| 3 | 10 |
| 4 | 10 |

| Index | Code Word | Symbol |
|---|---|---|
| 1 | 1 | Symbol A |
| 2 | 01 | Symbol B |
| 3 | 001 | Symbol C |
| 4 | 0001 | Symbol D |

820'

| Index | Counter Value |
|---|---|
| 1 | 25 |
| 2 | 10 |
| 3 | 10 |
| 4 | 11 |

| Index | Code Word | Symbol |
|---|---|---|
| 1 | 1 | Symbol A |
| 2 | 01 | Symbol D |
| 3 | 001 | Symbol B |
| 4 | 0001 | Symbol C |

840

820''

| Index | Counter Value |
|---|---|
| 1 | 25 |
| 2 | 11 |
| 3 | 10 |
| 4 | 10 |

| Index | Counter Value (in Decimals) | Counter Value (in 8-bit Binary) |
|---|---|---|
| 1 | 250 | 11111010 |
| 2 | 103 | 01100111 |
| 3 | 25 | 00011001 |

| Index | Counter Value (in Decimals) | Counter Value (in 8-bit Binary) |
|---|---|---|
| 1 | 125 | 01111101 |
| 2 | 51 | 00110011 |
| 3 | 12 | 00001100 |

FIG. 14

Software for described technologies 1680

VARIABLE LENGTH CODING AND DECODING USING COUNTERS

FIELD

This application relates to video encoding and decoding, and in particular, to variable length coding and decoding strategies that use counters.

BACKGROUND

As the use of video has become more popular, video has become available in a wide variety of video formats. These video formats are provided by using traditional video coding and decoding techniques that are able to compress video for storage and transmission, and are able to decompress video for viewing. Compression and decompression of video, however, consumes computing resources and time. Although traditional video coding and decoding techniques can be used to encode and decode digital video data, such techniques are limited and computationally inefficient, especially as the demand for higher quality digital video compression and decompression increases. Accordingly, more computationally efficient encoding and decoding techniques (e.g., techniques that reduce the overall number of bits used during encoding and decoding) are desired.

SUMMARY

Among other innovations described herein, this disclosure presents various tools and techniques for using counters during variable length coding or decoding. For instance, certain embodiments of the disclosed technology can be used to perform computationally efficient entropy coding or decoding during video compression or decompression. Certain implementations of the disclosed technology allow more recently encoded or decoded codewords to have a greater influence on codeword remapping than codewords encoded or decoded earlier.

The described tools and techniques can be implemented separately, or in various combinations with each other. As will be described more fully below, the described tools and techniques can be implemented by a variety of hardware devices with which or in connection with which efficient digital media data compression or decompression is desired (e.g., a video encoder or decoder). Such hardware devices include, for example, televisions, digital video receivers, mobile devices (such as cell phones, smart phones, personal digital assistants ("PDAs"), handheld computers, touchscreen tablet computers, laptop computers, portable media players, or personal entertainment systems) as well as other computing devices (such as desktop computers or entertainment consoles).

In one exemplary implementation described herein, a first codeword is received from compressed digital media data. The first codeword is decoded into a first digital media data value by referencing a codeword table that associates the first codeword with the first digital media data value and also associates a second codeword with a second digital media data value. In certain implementations, the second codeword is the next simplest codeword in the codeword table relative to the first codeword (e.g., the second codeword is listed just in front of the first codeword in the codeword table). A counter for counting occurrences of the first digital media data value is incremented. The value of the first counter is compared with the value of a second counter that counts occurrences of a second digital media data value. If the value of the first counter and the value of the second counter are equal (or, some implementations, greater than or equal), the codeword table is updated to swap codewords between the first and second digital media values.

In a further exemplary implementation, a first syntax element value is encoded with a first codeword according to a table that correlates at least the first codeword with the first syntax element value and a second codeword with a second syntax element value. In this embodiment, the first codeword has more bits than the second codeword. A first counter associated with the first codeword is incremented and the value of the first counter is compared with the value of a second counter associated with the second codeword. If the value of the first counter is at least equal to the value of the second counter, the second codeword is swapped with the first codeword such that the second codeword is associated with the first syntax element value and the first codeword is associated with the second syntax element value. If the value of the first counter is less than the value of the second counter, the second codeword is not swapped with the first codeword.

In another exemplary implementation, a plurality of codewords are decoded from a bitstream of compressed video information such that the codewords are replaced by corresponding symbols associated with the codewords. Counters that account for the occurrence of each of the symbols are incremented during the decoding. The values of the counters are periodically reduced in order to prevent the values of the counters from exceeding an overflow limit. For example, the number of symbols from the table that occur in the bitstream can be counted (e.g., in a sum counter for counting the sum of counter increments) and the act of periodically reducing can be performed by reducing the values of the counters when the number of symbols from the table that occur in the bitstream reaches a threshold value.

This summary is provided to introduce a selection of concepts in a simplified form that are further described below. This summary is not intended to identify key features or essential features of the claimed subject matter, nor is it intended to be used to limit the scope of the claimed subject matter. The foregoing and other objects, features, and advantages of the technologies will become more apparent from the following detailed description, which proceeds with reference to the accompanying figures.

BRIEF DESCRIPTION OF THE DRAWINGS

FIGS. 4, 5, and 6 are schematic block diagrams illustrating the first exemplary counter-based codeword remapping technique through an exemplary codeword table and counter array.

FIGS. 8, 9, and 10 are schematic block diagrams illustrating the second exemplary counter-based codeword remapping technique through an exemplary codeword table and counter array.

FIGS. 13 and 14 are schematic block diagrams illustrating the first exemplary overflow avoidance strategy through an exemplary counter array.

DETAILED DESCRIPTION

I. General Considerations

Disclosed below are representative embodiments of methods, apparatus, and systems for performing variable length coding or variable length decoding using counters. The disclosed methods, apparatus, and systems should not be construed as limiting in any way. Instead, the present disclosure is directed toward all novel and nonobvious features and aspects of the various disclosed embodiments, alone and in various combinations and sub-combinations with one another. Furthermore, any features or aspects of the disclosed embodiments can be used alone or in various combinations and sub-combinations with one another. The disclosed methods, apparatus, and systems are not limited to any specific aspect or feature or combination thereof, nor do the disclosed embodiments require that any one or more specific advantages be present or problems be solved Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods, apparatus, and systems can be used in conjunction with other methods, apparatus, and systems. Furthermore, as used herein, the term "and/or" means any one item or combination of items in the phrase.

II. Exemplary Encoders and Decoders

A. Overview

Figure 1:
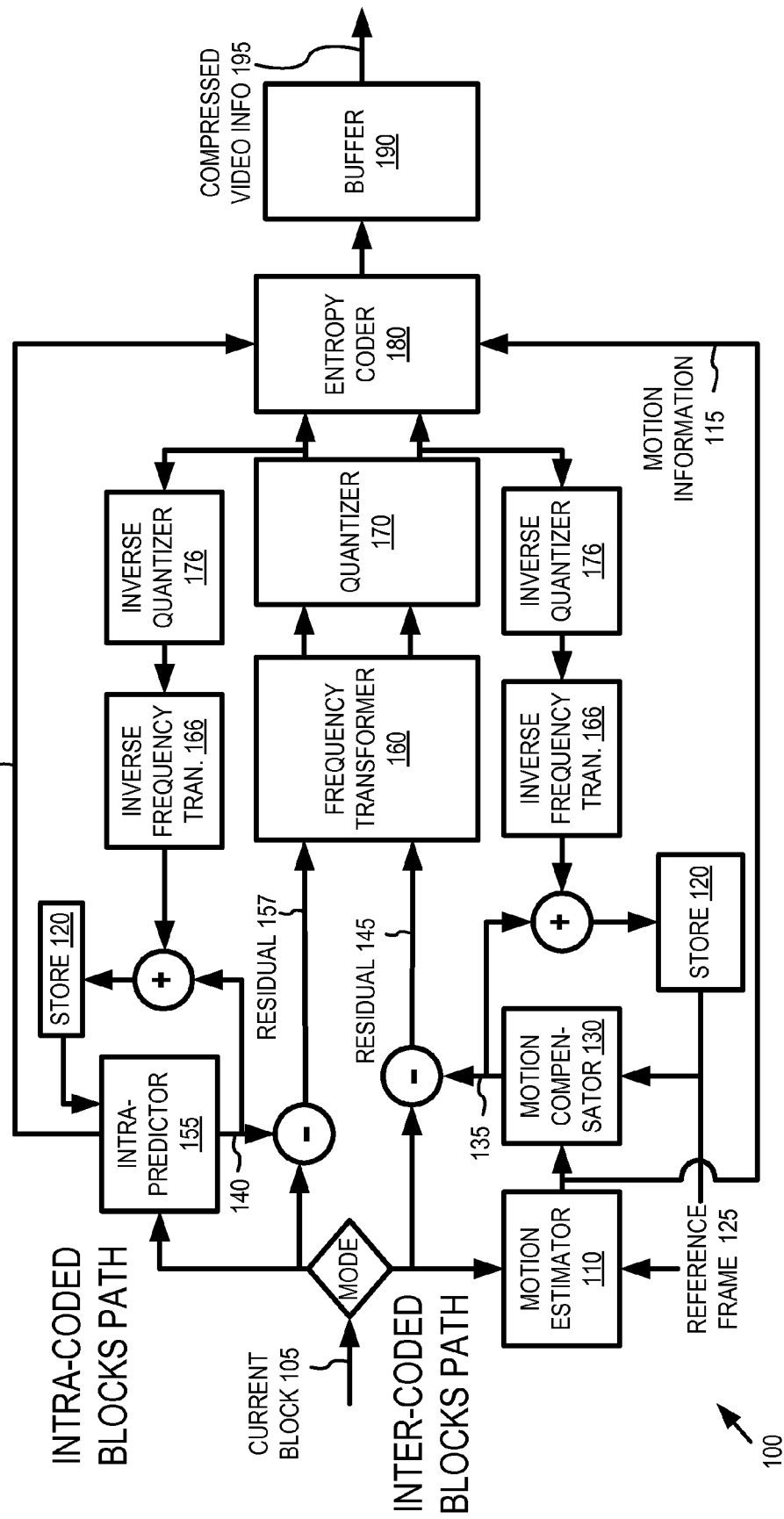
FIG. 1 is a schematic diagram of a generalized example of a suitable video encoder system for use with certain disclosed embodiments.
Figure 2:
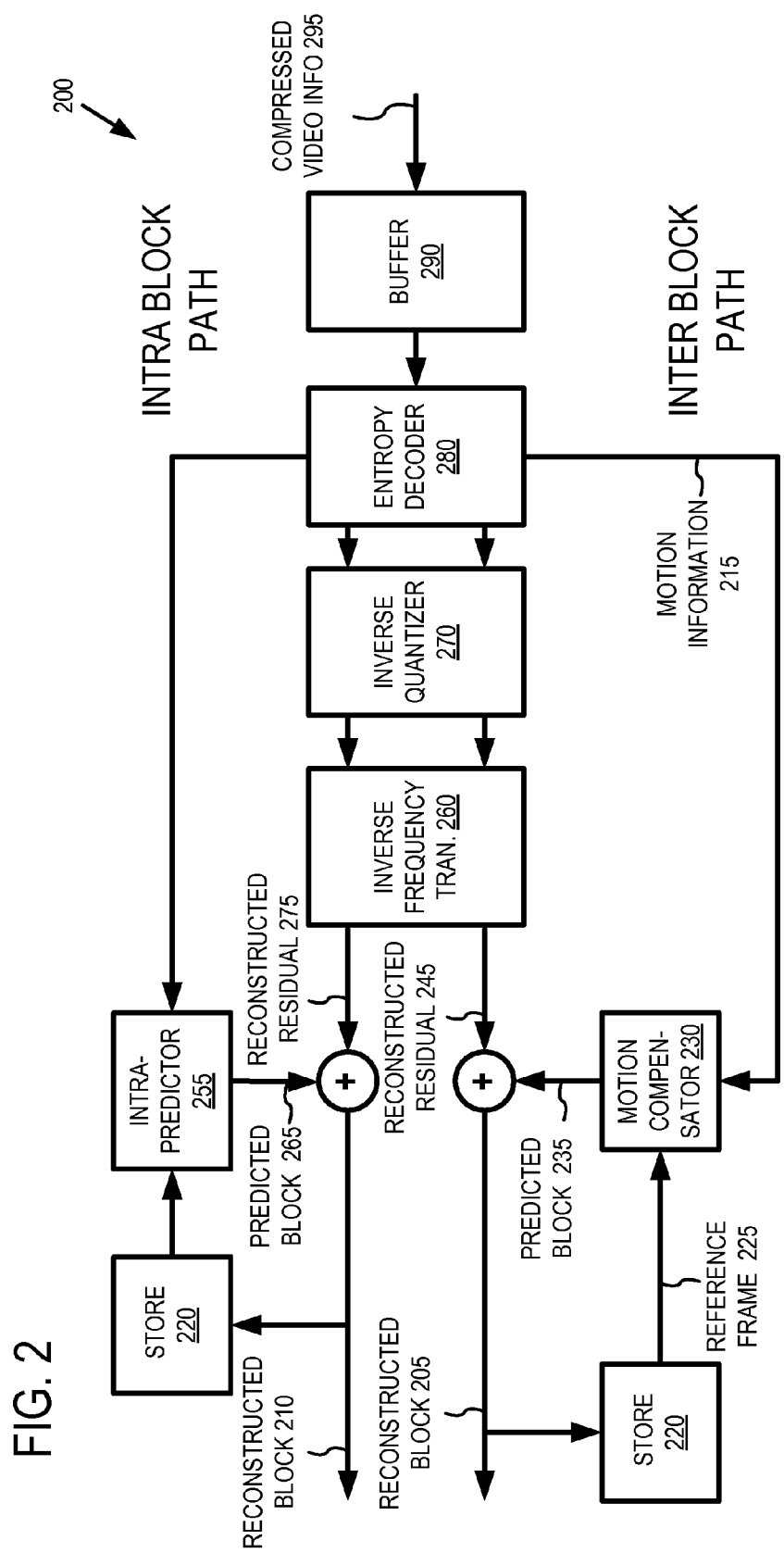
FIG. 2 is a schematic diagram of a generalized example of a suitable video decoder system for use with certain disclosed embodiments.

FIG. 1 is a schematic diagram of a generalized video encoder system 100, and FIG. 2 is a schematic diagram of a video decoder system 200, in conjunction with which various ones of the disclosed embodiments described herein can be implemented.

The relationships shown between modules within the encoder and decoder indicate the flow of information in the encoder and decoder; other relationships are not shown for the sake of simplicity. In particular, FIGS. 1 and 2 usually do not show side information indicating the encoder settings, modes, tables, flags, syntax elements, etc. used for a video sequence, frame, macro-block, slice, block, or other such information. Such side information is sent in the output bitstream, typically after entropy encoding of the side information and can include, for example, syntax elements encoded using a code table. The format of the output bitstream can be the High-Efficiency Video Coding ("HEVC") format or another video coding format.

Depending on the implementation and the type of compression desired, modules of the encoder or decoder can be added, omitted, split into multiple modules, combined with other modules, and/or replaced with like modules. In alternative embodiments, encoders or decoders with different modules and/or other configurations of modules perform one or more of the described techniques.

B. Exemplary Video Encoder

FIG. 1 is a schematic diagram of a generalized video encoder system 100 that can perform encoding using any of the counter-based variable length coding techniques disclosed below. The encoder system 100 receives a sequence of video frames and produces compressed video information 195 as output. For example, the compressed video information can be a compressed video bitstream or coded video bitstream, and a frame can be a picture in the sequence of pictures in the video. Particular embodiments of video encoders can use a variation or supplemented version of the generalized encoder 100.

The encoder system 100 can compress frames of a video sequence (e.g., predicted frames and key frames). For the sake of presentation, FIG. 1 shows a path for encoding blocks of a frame using inter-prediction through the encoder system 100 (shown as the inter-coded blocks path) and a path for encoding blocks of a frame using intra-prediction (shown as the intra-coded blocks path). Many of the components of the encoder system 100 can be used for compressing both inter-predicted and intra-predicted blocks. In the illustrated embodiments, components that can be shared are labeled with the same number, though it is to be understood that each path can be implemented using separate dedicated components as well. The exact operations performed by those components can vary depending on the type of information being compressed.

An inter-coded block is represented in terms of prediction (or difference) from one or more other blocks. A prediction residual is the difference between what was predicted and the original block. In contrast, an intra-coded block is compressed without reference to other frames. When encoding a block, the encoder system 100 can choose to encode the block using an inter-prediction mode and/or an intra-prediction mode.

If a current block 105 is to be coded using inter-prediction, a motion estimator 110 estimates motion of the current block 105, or sets of pixels of the current block 105 with respect to a reference frame using motion information, where the reference frame is a previously reconstructed frame 125 buffered in the store 120. In alternative embodiments, the reference frame is a temporally later frame or the current block is bi-directionally predicted. The motion estimator 110 can output as side information motion information 115 such as motion vectors, inter-prediction directions, and/or reference frame indices. A motion compensator 130 applies the motion information 115 to the reconstructed previous decoded frame (the reference frame) 125 to form a motion-compensated current block 135. The prediction is rarely perfect, however, and the difference between the motion-compensated current block 135 and the original current block 105 is the prediction residual 145. Alternatively, a motion estimator and motion compensator apply another type of motion estimation/compensation.

If the current block 105 is to be coded using intra-prediction, an intra-predictor 155 creates an intra-predicted current block prediction 140 from stored pixels of the frame that includes the current block 105, and the stored pixels are previously reconstructed pixels buffered in the store 120. The intra-predictor 155 can output side information such as intra-prediction direction 158. The prediction is rarely perfect, however, and the difference between the stored pixels and the original current block 105 is the prediction residual 157.

A frequency transformer 160 converts the spatial domain video information into frequency domain (e.g., spectral) data using a frequency transform. A quantizer 170 then quantizes the blocks of spectral data coefficients.

When a reconstructed current block or frame is needed for subsequent motion estimation/compensation and/or intra-prediction, an inverse quantizer 176 performs inverse quantization on the quantized spectral data coefficients. An inverse frequency transformer 166 then performs the inverse of the operations of the frequency transformer 160, producing a reconstructed residual. If the current block 105 was coded using inter-prediction, the reconstructed prediction residual is added to the motion-compensated current block 135 to form the reconstructed current block. If the current block 105 was coded using intra-prediction, the reconstructed prediction residual is added to the intra-predicted current block prediction 140 to form the reconstructed current block. The store 120 can buffer the reconstructed current block for use in predicting subsequent frames or blocks.

The entropy coder 180 compresses the output of the quantizer 170 as well as certain side information (e.g., motion information 115, modes, quantization step size, etc.). Typical entropy coding techniques include arithmetic coding, variable length coding, differential coding, Huffman coding, run length coding, LZ coding, dictionary coding, and combinations of the above. The entropy coder 180 typically uses different coding techniques for different kinds of information (e.g., DC coefficients, AC coefficients, different kinds of side information), and can choose from among multiple code tables within a particular coding technique. To perform variable length coding, the entropy coder 180 can use any of the counter-based variable length coding techniques described below.

The entropy coder 180 stores compressed video information 195 in the buffer 190. The compressed video information 195 is depleted from the buffer 190 at a constant or relatively constant bit rate and stored for subsequent streaming at that bit rate. Alternatively, the encoder system 100 streams compressed video information immediately following compression.

The encoder 100 can produce a bitstream and perform variable length coding using counters as described below. The encoder may also use the techniques described herein in various combinations, individually, or in conjunction with other techniques. Alternatively, another encoder or tool performs one or more encoding techniques.

C. Exemplary Video Decoder

FIG. 2 is a schematic diagram of a general video decoder system 200 that can perform decoding using any of the counter-based variable length coding techniques described below. Further, so long as the encoder system 100 and the decoder system 200 use a common set of coding rules for encoding and decoding, the accuracy of the decompressed picture information can be maintained. The decoder system 200 receives information 295 for a compressed sequence of video frames (e.g., via a compressed video bitstream) and produces output including a reconstructed block 205. Particular embodiments of video decoders can use a variation or supplemented version of the generalized decoder 200.

The decoder system 200 decompresses blocks coded using inter-prediction and/or intra-prediction. For the sake of presentation, FIG. 2 shows a path for intra-coded blocks through the decoder system 200 (shown as the intra block path) and a path for inter-coded blocks (shown as the inter block path). Many of the components of the decoder system 200 are used for decompressing both inter-coded and intra-coded blocks. The exact operations performed by those components can vary depending on the type of information being decompressed.

A buffer 290 receives the information 295 for the compressed video sequence and makes the received information available to the entropy decoder 280. The buffer 290 typically receives the information at a rate that is fairly constant over time. The buffer 290 can include a playback buffer and other buffers as well. Alternatively, the buffer 290 receives information at a varying rate.

The entropy decoder 280 entropy decodes entropy-coded quantized data as well as entropy-coded side information (e.g., motion information 215, flags, modes, syntax elements, and other side information), typically applying the inverse of the entropy encoding performed in the encoder. For example, the entropy decoder 280 can use any of the disclosed counter-based variable length coding techniques described below to perform decoding (e.g., decoding of syntax elements). An inverse quantizer 270 inverse quantizes entropy-decoded data. An inverse frequency transformer 260 converts the quantized, frequency domain data into spatial domain video information by applying an inverse transform such as an inverse frequency transform.

If the block 205 to be reconstructed is an inter-coded block using forward-prediction, a motion compensator 230 applies motion information 215 (e.g., predicted motion information) to a reference frame 225 to form a prediction 235 of the block 205 being reconstructed. A buffer (store) 220 stores previous reconstructed frames for use as reference frames. Alternatively, a motion compensator applies other types of motion compensation. The prediction by the motion compensator is rarely perfect, so the decoder 200 also reconstructs a prediction residual 245 to be added to the prediction 235 to reconstruct block 205.

When the decoder needs a reconstructed frame for subsequent motion compensation, the store 220 buffers the reconstructed frame for use in predicting a subsequent frame. In some implementations of predicting a frame, the frame is predicted on a block-by-block basis (as illustrated) and respective blocks of the frame can be predicted. One or more of the predicted blocks can be predicted using motion information from blocks in the same frame or one or more blocks of a different frame.

If the block 205 to be reconstructed is an intra-coded block, an intra-predictor 255 forms a prediction 265 of the block 210 being reconstructed. The buffer (store) 220 stores previous reconstructed blocks and frames. The prediction by the motion compensator is rarely perfect, so the decoder 200 also reconstructs a prediction residual 275 to be added to the prediction 265 to reconstruct block 210.

The decoder 200 can decode a compressed video bitstream, and perform counter-based variable length decoding using any of the embodiments described below. The decoder may also use the techniques described herein in various combinations, individually, or in conjunction with other techniques. Alternatively, another decoder or tool performs one or more decoding techniques.

II. Exemplary Embodiments of the Disclosed Technology

A. Introduction

Variable length coding can be used during source encoding or decoding, including file compression or decompression, image/video encoding or decoding, audio encoding or decoding, or other digital media data encoding or coding. For example, variable length coding can be used by an entropy coder (such as entropy coder 180) during a video encoding process and by an entropy decoder (such as entropy decoder 280) during a video decoding process.

When using variable length coding, symbols that occur more frequently will be assigned shorter code words than others. For example, assume that a sequence of symbols $\{s_i\}$ is to be compressed. Also assume that for each symbol $s_i$ in the sequence $\{s_i\}$, the symbol can have one value from a symbol set $A=\{a_1, a_2, \ldots, a_k\}$, where k is the size of A. If in the sequence $\{s_i\}$, the probabilities of $\{a_1, a_2, \ldots, a_k\}$ satisfy $p_{a1} \geq p_{a2} \geq \ldots \geq p_{ak}$, where $p_{ai}$ is the probability of $a_i$, code words $\{c_1, c_2, \ldots, c_k\}$ can be assigned for $\{a_1, a_2, \ldots, a_k\}$ that guarantee that when i<j, the length of $c_i$ is not larger than that of $c_j$. For example, let $$c_i = \underbrace{0 \ldots 0}_{i} 1.$$

By doing so, the symbol that has a higher probability can be represented by fewer bits, thus enabling compression to occur.

In practice, the probabilities for symbols are not stationary. For example, during encoding or decoding of video images, the probability of occurrence of certain sequences of symbols can change. For example, for different regions within an image or for different frames (e.g., after a scene change), the statistics can be very different. To give a variable length coding scheme the capability of adapting to statistical changes, an adaptation scheme can be used to dynamically adjust the mapping between symbols and code words. By using such an adaptive scheme, one can help ensure that the code words for symbols that are more likely to occur will be short.

One possible adaptation scheme is to automatically swap the code words for symbols $a_{i-1}$ and $a_i$ whenever $a_i$ happens in the sequence (e.g., in the bitstream during decoding). Consequently, when $a_i$ happens again, it will have a shorter code word. Such a "meet-then-swap" scheme is simple but does not accurately account for the cumulative statistics of the occurrence of the symbol, as a swap is triggered only by the recent occurrence of the symbol. Furthermore, such a scheme can be computationally burdensome because numerous unnecessary swaps may be made in the course of video encoding or decoding.

Instead of a "meet-then-swap" scheme, a counter-based approach for adapting code words in a variable length coding scheme can be used. The theoretical foundation for an embodiment of a counter-based approach can be explained as follows. As above, assume that a sequence of symbols $\{s_i\}$ is to be coded. Also assume that the symbol set is symbol set $A=\{a_1, a_2, \ldots, a_k\}$. There is a code word set $\{c_1, c_2, \ldots, c_k\}$ that satisfies the desired goal that the length of $c_i$ is not larger than $c_j$ for any $1 \leq i \leq j \leq k$. Further, there is a one-to-one mapping between $\{a_1, a_2, \ldots, a_k\}$ and $\{c_1, c_2, \ldots, c_k\}$ so that each symbol is mapped to one code word and different symbols are mapped to different code words. Let $M()$ denote this mapping between $\{a_1, a_2, \ldots, a_k\}$ and $\{c_1, c_2, \ldots, c_k\}$, and let $M^{-1}()$ denote the inverse. So $j=M(i)$ and $i=M^{-1}(j)$ if $a_i$ is mapped to $c_j$.

B. Exemplary Codeword Mapping Adjustment Strategies

In one exemplary embodiment of the disclosed technology, for each symbol $a_i$, a counter $t_i$ is maintained to record how many times $a_i$ has occurred so far. The counters can be reset periodically to zero or default settings (e.g., at regular intervals). For example, the counters can be reset with every block, with every x blocks, with every frame, with every x frames, with every key frame, or on some other basis. Alternatively, the counters can be continuously updated and incremented throughout an encoding or decoding process.

In certain implementations, after coding each symbol, the corresponding counter will be increased by one. In other implementations, the amount the counter is incremented can vary (e.g., the counter can increase by 2, 3, or any other value). Based on the counter value, a determination can be made as to whether the mapping between symbols and code words is to be adjusted. A variety of different strategies can be employed to adjust the mapping.

According to a first mapping adjustment strategy, for any $1<j \leq k$, after counter $t_{M^{-1}(j)}$ is updated, if $t_{M^{-1}(j)} \geq t_{M^{-1}(j-1)}$, then the code words for $a_{M^{-1}(j)}$ and $a_{M^{-1}(j-1)}$ are swapped. Or, in a more specific implementation, if $t_{M^{-1}(j)} = t_{M^{-1}(j-1)}$, then the codewords for $a_{M^{-1}(j)}$ and $a_{M^{-1}(j-1)}$ are swapped. For example, if the original mapping is $i_{j-1}=M^{-1}(j-1)$ and $i_j=M^{-1}(j)$, then, after the swapping, the mapping will be $i_j=M^{-1}(j-1)$ and $i_{j-1}=M^{-1}(j)$. Typically, this swapping is performed by modifying the assigned symbols in the codeword table such that the codeword previously associated with symbol $a_{M^{-1}(j)}$ is associated with $a_{M^{-1}(j-1)}$, and such that the codeword previously associated with symbol $a_{M^{-1}(j-1)}$ is associated with $a_{M^{-1}(j)}$.

Figure 3:
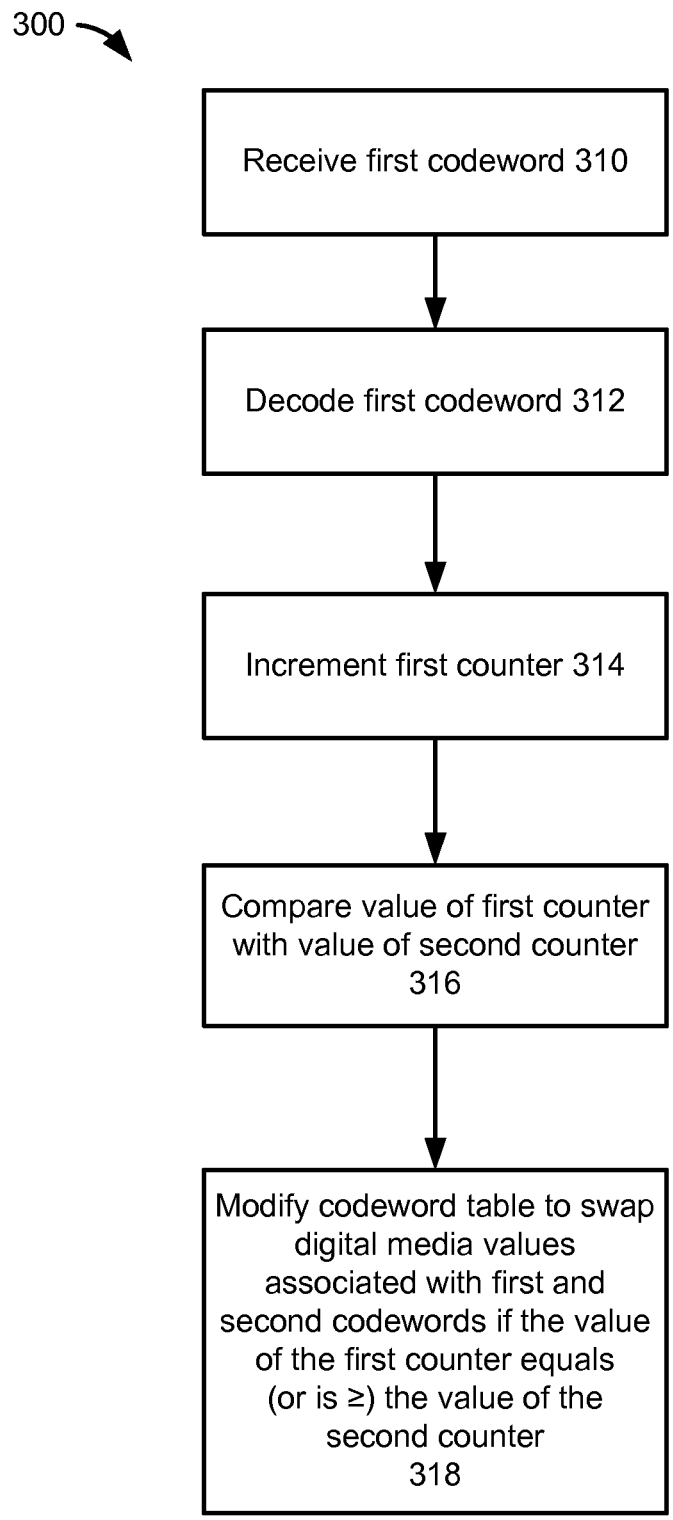
FIG. 3 is a flow chart of a first exemplary counter-based codeword remapping technique.

FIG. 3 is a flow chart illustrating an embodiment 300 of the first exemplary mapping adjustment strategy. The method acts illustrated in FIG. 3 should not be construed as limiting, as any of the illustrated method acts can be performed alone or in any combination or subcombination with one another or with other method acts.

At 310 a first codeword is received (e.g., buffered, loaded, or otherwise prepared for further processing). The first codeword can be included, for example, in compressed digital media data, such as a compressed bitstream encoded according to a variety of encoding standards (e.g., the HEVC standard).

At 312, the first codeword is decoded. For example, the first codeword can be decoded into a first digital media data value by referencing a codeword table. The codeword table can be a table, data structure, or other description of data that associates digital media data values with corresponding codewords. In the illustrated example, the codeword table associates the first codeword with the first digital media data value and associates a second codeword with a second digital media data value. Furthermore, in the example illustrated in FIG. 3, the first codeword has more bits than the second codeword.

The digital media data values that are described by the codeword table can correspond to a variety of digital media values that are used during the encoding and/or decoding process. For example, the digital media values can be syntax elements that are parsed during decoding. The syntax elements can be syntax elements for coded block pattern processing (e.g., encoding and decoding from CBP tables), for coded block flag processing (e.g., encoding and decoding from CBF tables), for processing from split tables (e.g., for inter mode), for processing tables for determining inter prediction direction or a reference frame index, or for any other such processing in which one or more codeword tables are used.

At 314, a first counter is incremented. The first counter can be a counter of fixed bit width (e.g., 1-8 bits) that is associated with the first codeword and used to count the occurrence of the codeword and first digital media data value in the compressed digital media data as it is decoded. The first counter can be incremented as a result of the first digital media data value being decoded at 312. One or more additional counters can also be present to count the occurrence of other digital media data values (e.g., other digital media data values defined by the same codeword table as the first digital media data value). For example, in the illustrated example, a second counter associated with the second codeword is present to count the occurrence of the second codeword and second digital media data value. In certain implementations, and as illustrated below, the counters for a particular codeword table can be maintained as an array.

At 316, the value of the first counter is compared to the value of the second counter. As noted, the second counter is for counting the occurrence of the second digital media data value. In certain implementations, the second digital media data value is associated with a second codeword that is adjacent to (next to) the first codeword in the codeword table. For instance, the second codeword can be the next simplest codeword in the codeword table relative to the first codeword.

At 318, if the value of the first counter is equal to the value of the second counter (or, in some implementations, at least equal to the value of the second counter; or, in further implementations, greater than or equal to the value of the second counter), then the codeword table is modified such that the first codeword is associated with the second digital media value and the second codeword is associated with the first digital media value. In other words, the first and second digital media values swap codewords. In this example, the swapping of codewords results in the first digital media value being associated with a codeword having fewer bits than the second digital media value. Additionally, depending on the implementation, the values of the counters may be swapped such that the counter for the first digital media value remains associated with the first digital media value after codewords are swapped. If the value of the first counter is less than the value of the second counter, then the codeword table is not modified.

In certain specific embodiments, an array of the counter values (counterArray) is indexed by a codeword number associated with a currently decoded codeword (codeNum). The resulting value can be described as: counterArray[codeNum]. Furthermore, in this implementation, the next simplest code word relative to the code word number (codeNum) is the previous code word number in the table (codeNumPre). At 318, a determination is made as to whether counterArray[codeNum]=counterArray[codeNumPre] (or, in certain implementations, whether counterArray[codeNum]≥counterArray[codeNumPre]). If so, then the values of counterArray[codeNum] and counterArray[codeNumPre] are swapped. Furthermore, the table for associating the codewords with corresponding syntax elements (indexMappingTable) is updated such that the syntax element values of indexMappingTable[codeNumPre] and indexMappingTable[codeNum] are also swapped.

Although it is not intuitive to swap when the counters are merely equal (e.g., as in the embodiments shown in FIG. 3), such a swapping scheme emphasizes codewords that are more recently encoded or decoded over codewords that were encoded or decoded earlier. For example, with such a swapping scheme, digital media data values (such as syntax elements) that were previously encoded or decoded many codewords before a current codeword have a weaker influence on how codewords are remapped. The resulting swapping scheme is consequently more responsive to the current state of the content of the digital media data being encoded or decoded than otherwise possible. This improved responsiveness can result in improved performance (e.g., by reducing the overall number of bits in a bitstream), especially in implementations where the counters are relatively frequently divided (e.g., by performing a bit shift) and consequently can have relatively small difference between them.

The method 300 can be performed continuously as digital media data values are decoded. Or, in some implementation, the counters are incremented as one or more digital media data values are decoded, but the counters are not compared to one another until a certain encoding or decoding event is reached (such as a completion of the encoding or decoding of a block, tile, or other partition).

Furthermore, in certain implementations, the process is adapted so that only a subset of the codewords in a codeword table are associated with counters, thus allowing counters to be used with only the more frequently occurring symbols in the codeword table. For instance, the process can be adapted so that codewords not associated with a codeword counter perform the aforementioned meet-then-swap procedure. In a particular implementation, and using the array notation introduced above, if codeNum is greater or equal to a total number of counters for a codeword table (counterNum), then the values of indexMappingTable[codeNumPre] and indexMappingTable[codeNum] can be exchanged with each other. In some instances, as a result of this meet-and-swap, the digital image data value associated with a codeword may become associated with a codeword for which a counter is present.

FIGS. 4, 5, and 6 are schematic block diagrams illustrating the swapping process of the first mapping strategy introduced above with respect to FIG. 3. For ease of illustration, the example shown in FIGS. 4-6 is for a decoding process, but the process could be adapted for encoding.

FIG. 4 illustrates an exemplary codeword table 410 having a column 412 listing an index value, a column 414 listing code words, and a column 416 listing symbols (such as digital media data values or syntax element values) associated with the codewords. Also shown is a counter array 420 having a column 422 listing the index value and a column 424 listing the current value of associated counters.

FIG. 5 illustrates the codeword table 410 (shown as 410') and the counter array 420 (shown 420') after the codeword "0001" is encountered during decoding of compressed digital media data (e.g., of a bitstream of compressed digital media data). Codeword "0001" corresponds to index "4" (also referred to as code word number "4")). Thus, the corresponding symbol, Symbol "D", is decoded from compressed digital media data. As a result, the corresponding counter value is incremented, as shown at 430.

FIG. 6 illustrates the codeword table 410 (shown as 410") and the counter array 420 (shown as 420") after the swapping procedures described above with respect to FIG. 3 are implemented. In particular, because the counter value for index "4" is equal to the counter value for index "3", symbol "C" and symbol "D" are swapped for one another in the codeword table as shown at 440. Also, optionally, the counter values are swapped (as shown by 442).

According to a second mapping strategy, after a counter $t_i$ is updated, the symbols are sorted according to the counter values so that a symbol with a larger counter count is located before another symbol with a smaller counter count. The sorted symbols are then remapped to code words $\{c_1, c_2, \ldots, c_k\}$, where $c_1$ is the code word of shortest code word length and $c_k$ is the code word of the greatest code word length. Consequently, when $t_i > t_{i-1}$, the code word length for $a_i$ will not be larger than that of $a_{i-1}$ after sorting and remapping.

Figure 7:
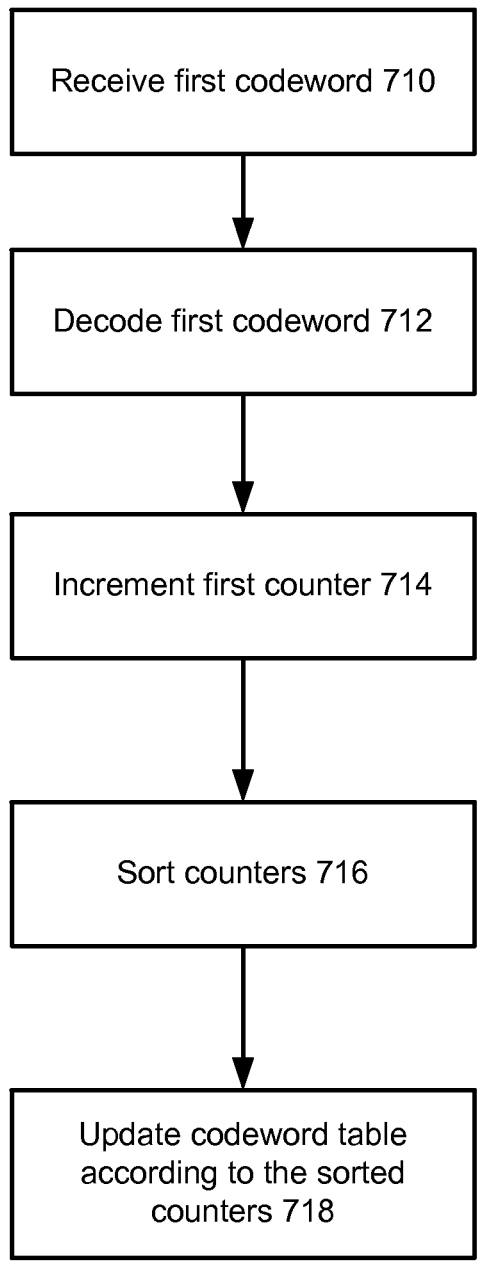
FIG. 7 is a flow chart of a second exemplary counter-based codeword remapping technique.

FIG. 7 is a flow chart illustrating the second exemplary mapping adjustment strategy. The method acts illustrated in FIG. 7 should not be construed as limiting, as any of the illustrated method acts can be performed alone or in any combination or subcombination with one another or with other method acts.

At 710 a first codeword is received (e.g., buffered, loaded, or otherwise prepared for further processing). The first codeword can be included in compressed digital media data, such as a compressed bitstream encoded according to a variety of encoding standards (e.g., the HEVC standard).

At 712, the first codeword is decoded. For example, the first codeword can be decoded into a first digital media data value by referencing a codeword table. The codeword table can be a table, data structure, or other description of data that associates digital media data values with corresponding codewords. In the illustrated example, the codeword table associates the first codeword with the first digital media data value and associates two or more other codewords with respective other digital media data values. As described above with respect to FIG. 3, the digital media data values that are described by the codeword table can correspond to a variety of digital media values (e.g., any of the syntax elements identified above) that are used during the encoding and/or decoding process.

At 714, a first counter is incremented. The first counter can be a counter of fixed bit width (e.g., 5-8 bits) that is associated with the first codeword and used to count the occurrence of the first digital media data value in the compressed digital media data as it is decoded. The first counter can be incremented as a result of the first digital media data value being decoded at 312. In this embodiment, two or more additional counters are also present to count the occurrence of two or more other digital media data values defined in the codeword table. In certain implementations, the counters for a particular codeword table are maintained as an array.

At 716, the values of the counters are sorted in descending (or, in certain implementations, ascending) order.

At 718, the codeword table is updated (or remapped) to account for the sorting of the counters. For example, if the first counter is incremented so that its value is greater than the value of the counters for the two next shortest codewords (e.g., codeNumPre and codeNumPre−1), then the codeword table can be updated so that the first digital media data value is assigned to the codeword associated with the shortest of the two next shortest codewords (in this example, codeNumPre−1). The digital media values previously associated with the next two shortest codewords are reassigned in sequence to the exchanged codewords.

FIGS. 8, 9, and 10 are schematic block diagrams illustrating the swapping process of the second mapping strategy introduced above with respect to FIG. 7. For ease of illustration, the example shown in FIGS. 8-10 is for a decoding process, but the process could be adapted for encoding.

FIG. 8 illustrates an exemplary codeword table 810 having a column 812 listing an index value, a column 814 listing code words, and a column 816 listing symbols (such as digital media data values or syntax element values) associated with the codewords. Also shown is a counter array 820 having a column 822 listing the index value and a column 824 listing the current value of associated counters.

FIG. 9 illustrates the codeword table 810 (shown as 810') and the counter array 820 (shown as 820') after the codeword "0001" is encountered during decoding of compressed digital media data (e.g., of a bitstream of compressed digital media data). Codeword "0001" corresponds to index "4" (also referred to as code word number "4")). Thus, the corresponding symbol, Symbol "D", is decoded from compressed digital media data. As a result, the corresponding counter value is incremented, as shown by 830.

FIG. 10 illustrates the codeword table 810 (shown as 810") and the counter array 820 (shown as 820") after the sorting and updating procedures described above with respect to FIG. 7 are implemented. In particular, because the counter value for index "4" is now greater than the counter values for indices "2" and "3", symbol "D" is remapped to index "2", symbol "B" to index "3", and symbol "C" to index "4", as shown at 840. Also, optionally, the counter values are similarly remapped (as shown by 842).

In general, the first exemplary mapping strategy is simpler than the second exemplary mapping strategy. For example, for the first exemplary mapping strategy, when one symbol is coded, only one swapping is used. By contrast, for the second exemplary mapping strategy, the sorting may involve numerous codeword remappings, which can be more computationally expensive than the single swap in the first exemplary mapping strategy. That said, the overall performance of the second exemplary mapping strategy can be better than the first exemplary mapping strategy. In the first exemplary mapping strategy, for instance, because a symbol ($a_i$) associated with an updated counter is swapped only with the adjacent symbol ($a_{i-1}$) if the updated counter is greater than or equal to the counter for the adjacent symbol, there may be other symbols (e.g., $a_{i-2}$) that also have a smaller counter than the symbol $a_i$ but that will not be swapped and will instead remain assigned to a shorter, but not necessarily more frequency encountered, codeword.

C. Exemplary Overflow Avoidance Strategies

For any of the described counter-based mapping adjustment strategies, the counters that are used to implement the strategies may eventually experience overflow problems. For example, unless the possibility of counter overflow is addressed, the counters may eventually exceed their capacity and fail to accurately account for each new occurrence of an associated symbol. For instance, the counter may be an 8-bit counter that can only represent a value from 0 to 255. To account for the possibility that the number of symbols counted by the counter exceeds 255, an overflow avoidance strategy can be employed. A number of different overflow avoidance strategies can be used according to embodiments of the disclosed technology.

Figure 11:
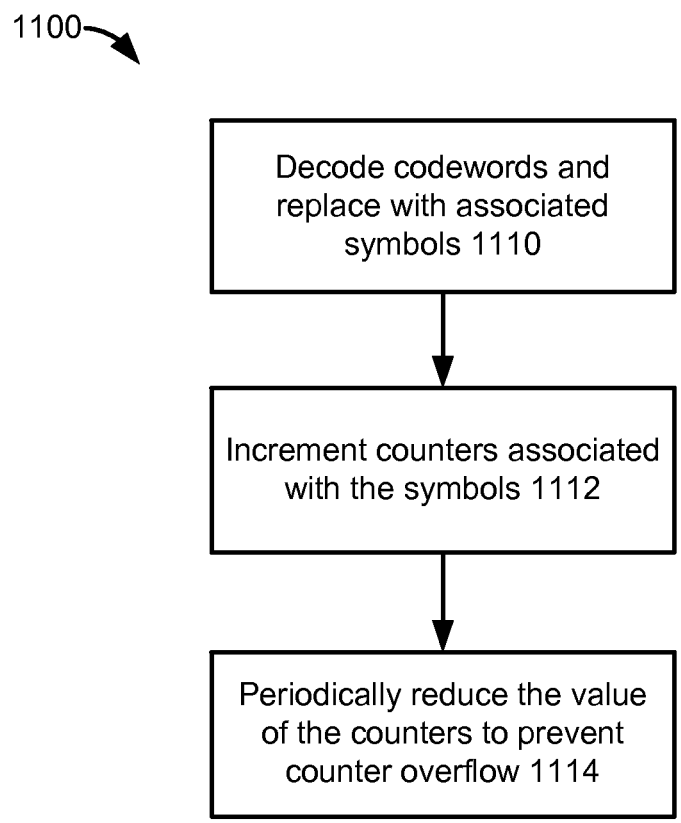
FIG. 11 is a flow chart of a generalized embodiment of an overflow avoidance strategy for use as part of a counter-based codeword remapping technique.

FIG. 11 is a flow chart illustrating an exemplary generalized method 1100 for implementing an overflow avoidance strategy. The method acts illustrated in FIG. 11 should not be construed as limiting, as any of the illustrated method acts can be performed alone or in any combination or subcombination with one another or with other method acts.

At 1110, a plurality of codewords are decoded from a bitstream of compressed video information such that the codewords are replaced by corresponding symbols associated with the codewords.

At 1112, counters that account for the occurrence of each of the symbols during the decoding are incremented. For instance, when a symbol is encountered during decoding, the corresponding counter is incremented.

At 1114, the values of the counters are periodically reduced in order to prevent the values of the counters from exceeding an overflow limit. More specific overflow avoidance strategies will now be explained.

According to a first overflow avoidance strategy, the counters $t_1$ to $t_k$ are divided by a given denominator d (e.g., after N symbols are coded or decoded). The division can be implemented as a bit shift (e.g., a right shift or a left shift depending on the endianess of the target architecture). For example, after N symbols are coded or decoded, then all counters can be right shifted by one bit. As a result, no counter will have a count larger than $$\sum_{i=0}^{\infty} \frac{N}{d^i}.$$

For instance, when d=1, the largest count of a counter is 2N.

In one implementation, for example, a "sum" counter (counterSum) is maintained that counts the total number of increments experienced by the counters of a codeword table. When the sum counter (counterSum) is greater than (or, in some implementations, equals) some value N (e.g., 15), then the sum counter is reset and the counters for the codeword table are right shifted by one or more bits (e.g., for i=0 . . . (counterNum−1), counterArray[i] is set to (counterArray[i]>>1).

A possible advantage that can be realized in implementations of the first overflow avoidance strategy is that digital media data values (such as syntax elements) that were previously encoded or decoded many codewords before a currently processed codeword will have a weaker influence on how codewords are remapped. In particular, when the counters are divided, the relative difference between the counters is decreased so that the count of current codewords is more likely to cause remapping to occur. In this way, the sum counter can be useful to maintain an adaptive remapping technique that weights codewords that are more recently encoded or decoded over codewords that are less recently encoded or decoded (e.g., codewords that were encoded or decoded before the last counter reduction). For this reason, it can be useful to set the threshold value for resetting to a relatively low number (e.g., 15) or other such low value (e.g., a value of 128 or less, such as 32 or less).

Figure 12:
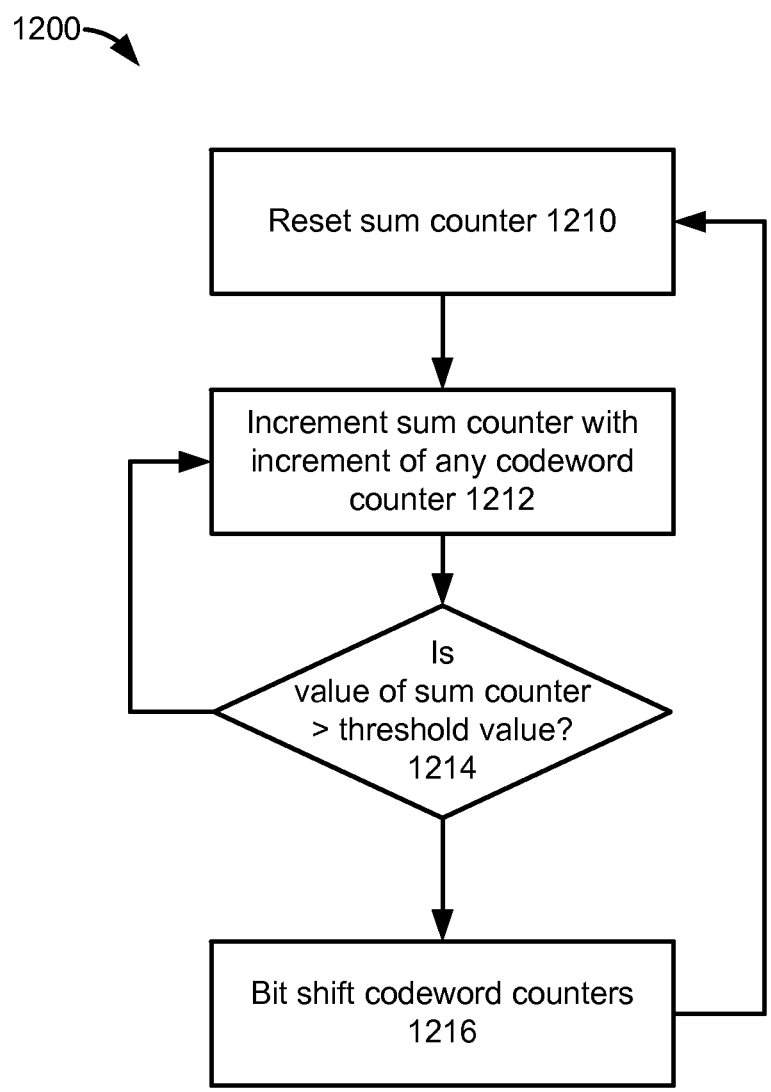
FIG. 12 is a flow chart of a first exemplary overflow avoidance strategy for use as part of a counter-based codeword remapping technique.

FIG. 12 is a flow chart illustrating an exemplary method 1200 for implementing the first overflow avoidance strategy. The method acts illustrated in FIG. 12 should not be construed as limiting, as any of the illustrated method acts can be performed alone or in any combination or subcombination with one another or with other method acts.

At 1210, a sum counter is reset. For instance, the sum counter is set to zero.

At 1212, the sum counter is incremented if any of the codeword counters associated with a given codeword table are incremented.

At 1214, the value of the sum counter is compared to a threshold value. If the value of the sum counter exceeds the threshold value, then the codeword counters are bit shifted at 1216 (e.g., by one or more bits) to perform a division operation, and the method restarts at 1210; otherwise, the method returns to 1212.

FIGS. 13 and 14 are schematic block diagrams illustrating the process of dividing the code word counters using a bit shift (in the illustrated embodiment, a right bit shift). In the illustrated example, a one-bit right shift is used, which corresponds to a division by 2 with downward rounding for any fractional remainder. This right-shift amount should not be construed as limiting; however, as different amounts of bit shifting can be performed.

FIG. 13 is a schematic block diagram of a counter array 1300 that includes a column 1310 identifying an index value, a column 1312 indicating a counter value in decimals, and a column 1314 indicating a counter value in 8-bit binary. FIG. 13 shows the counter array 1300 prior to the right-bit shifting that is performed at 1216 of FIG. 12.

FIG. 14 is a schematic block diagram of the counter array 1300 (shown as counter array 1300') after the right bit shifting has been performed. A column identifying an index value (shown as column 1310'), a column indicating a counter value in decimals (shown as column 1312'), and a column indicating a counter value in 8-bit binary (shown as column 1314') are also shown. As seen in column 1314', the binary values of the counters have been shifted rightward by one bit, resulting in a division by 2 with downward rounding. The resulting decimal values are shown in column 1312'.

According to a second overflow avoidance strategy, when the count for a particular counter $t_i$ is larger than a given value N, counters $t_1$ to $t_k$ are divided by a given denominator d (e.g., the counters can be divided by 2). The division can be implemented, for example, as a right bit shift (e.g., for a division by 2, a one-bit right shift can be implemented). Consequently, no counter will have a count larger than N.

Figure 15:
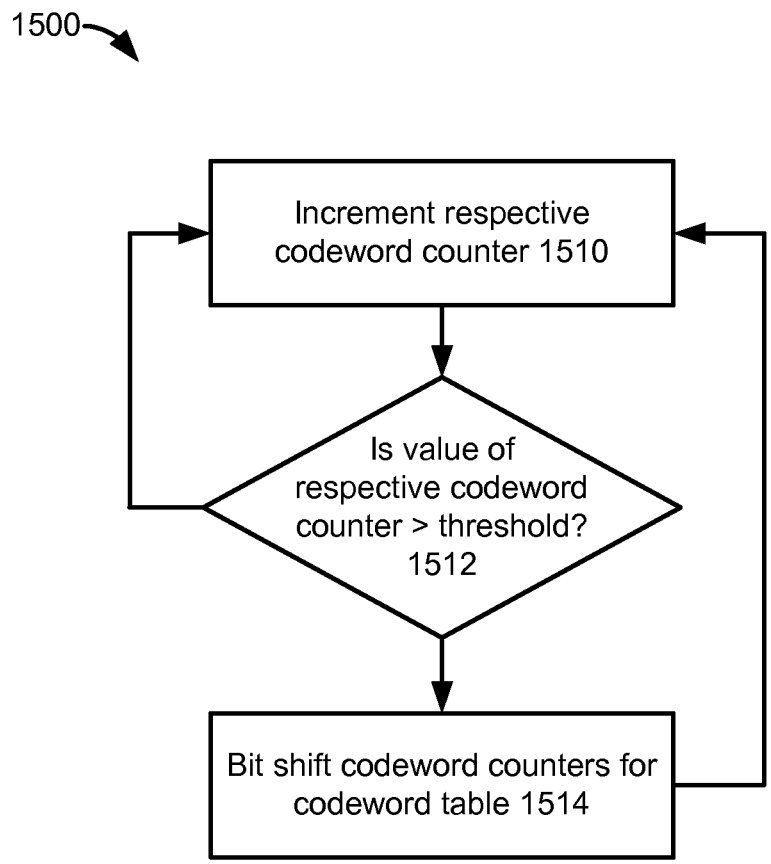
FIG. 15 is a flow chart of a second exemplary overflow avoidance strategy for use as part of a counter-based codeword remapping technique.

FIG. 15 is a flow chart illustrating an exemplary method 1500 for implementing the second overflow avoidance strategy. The method acts illustrated in FIG. 15 should not be construed as limiting, as any of the illustrated method acts can be performed alone or in any combination or subcombination with one another or with any other method act.

At 1510, a codeword counter associated with a codeword table is incremented. For instance, a respective codeword counter can be incremented as a result of the corresponding codeword being encountered during encoding or decoding.

At 1512, the value of the codeword counter is compared to a threshold value. If the value of the codeword counter exceeds the threshold value, then multiple (e.g., all) codeword counters associated with the codeword table are bit shifted at 1514 (e.g., by one or more bits) to implement a division operation and the method restarts at 1510 when the next codeword is encountered; otherwise, no division operation is performed and the method returns to 1510 when the next codeword is encountered.

As with the first overflow avoidance strategy, the second overflow avoidance strategy results in more recently encoded or decoded symbols having greater influence over remapping than earlier encoded or decoded symbols. However, because the second strategy depends on an individual counter reaching a threshold value, the first overflow avoidance strategy places higher priority on recent symbols relative to the second overflow avoidance strategy.

In general, the first overflow avoidance strategy is simpler to implement because the division is performed in a fixed pattern. By contrast, for the second overflow avoidance strategy, after coding each symbol, the counters are checked to determine if a division is needed or not.

As noted, another consequence of the exemplary overflow avoidance strategies introduced above are that a lower priority is given to past symbols. As a result, recent symbols have a greater capability to influence the mapping between symbols and code words. Such characteristics often match the practical signals so that it may help to improve the compression performance.

In image/video coding, an image is often divided into non-overlapped blocks. When counters are maintained for the coding for different blocks, the neighboring blocks' counters can be used to initiate the mapping for the current block

III. Exemplary Computing Environment

Figure 16:
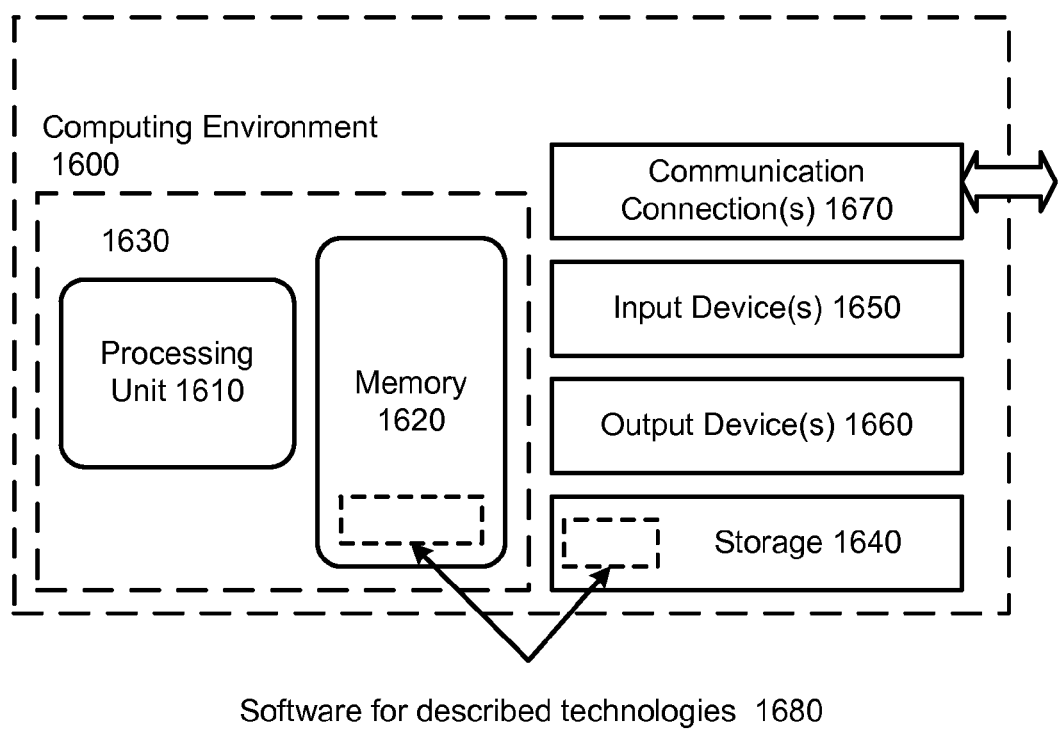
FIG. 16 is a schematic diagram illustrating a generalized example of a suitable computing environment for any of the disclosed embodiments.

FIG. 16 illustrates a generalized example of a suitable computing environment 1600 in which the described embodiments, techniques, solutions, and technologies can be implemented. The computing environment 1600 is not intended to suggest any limitation as to scope of use or functionality of the technology, as the technology may be implemented in diverse general-purpose or special-purpose computing environments. For example, the disclosed technology may be implemented using one or more computing devices comprising a processing unit, memory, and storage storing computer-executable instructions implementing the technologies described herein. For example, computing devices include server computers, desktop computers, laptop computers, notebook computers, netbooks, tablet computers, mobile devices, PDA devices, digital decoders, entertainment consoles, and other types of computing devices (e.g., devices such as televisions, media players, or other types of entertainment devices that comprise computing capabilities such as audio/video streaming capabilities and/or network access capabilities). The disclosed technology can also be implemented with other computer system configurations, including hand-held devices, multiprocessor systems, microprocessor-based or programmable consumer electronics, network PCs, minicomputers, mainframe computers, a collection of client/server systems, or the like. The disclosed technology can also be practiced in distributed computing environments where tasks are performed by remote processing devices that are linked through a communications network. In a distributed computing environment, program modules may be located in both local and remote memory storage devices. Additionally, the techniques, technologies, and solutions described herein can be performed in a cloud computing environment (e.g., comprising virtual machines and underlying infrastructure resources).

With reference to FIG. 16, the computing environment 1600 includes at least one central processing unit 1610 and memory 1620. In FIG. 16, this basic configuration 1630 is included within a dashed line. The central processing unit 1610 executes computer-executable instructions. In a multi-processing system, multiple processing units execute computer-executable instructions to increase processing power and as such, multiple processors can be running simultaneously. The memory 1620 can be volatile memory (e.g., registers, cache, RAM), non-volatile memory (e.g., ROM, EEPROM, flash memory, etc.), or some combination of the two. The memory 1620 stores software 1680 that can, for example, implement one or more of the technologies described herein. A computing environment can have additional features. For example, the computing environment 1600 includes storage 1640, one or more input devices 1650, one or more output devices 1660, and one or more communication connections 1670. An interconnection mechanism (not shown) such as a bus, a controller, or a network, interconnects the components of the computing environment 1600. Typically, operating system software (not shown) provides an operating environment for other software executing in the computing environment 1600, and coordinates activities of the components of the computing environment 1600.

The storage 1640 can be removable or non-removable, and includes magnetic disks, magnetic tapes or cassettes, CD-ROMs, CD-RWs, DVDs, or any other such tangible, non-transitory storage medium that can be used to store information and that can be accessed within the computing environment 1600. The storage 1640 stores computer-executable instructions for the software 1680, which can implement technologies described herein.

The input device(s) 1650 may be a touch input device, such as a keyboard, keypad, mouse, touch screen, controller, pen, or trackball, a voice input device, a scanning device, or another device, that provides input to the computing environment 1600. The output device(s) 1660 may be a display, printer, speaker, CD-writer, DVD-writer, or another device that provides output from the computing environment 1600.

The communication connection(s) 1670 enable communication over a communication medium (e.g., a connecting network) to another computing entity. The communication medium conveys information such as computer-executable instructions, compressed graphics information, compressed or uncompressed video information, or other data in a modulated data signal.

IV. Further Considerations

Any of the disclosed methods can be implemented using software comprising computer-executable instructions stored on one or more computer-readable media (e.g., non-transitory computer-readable media, such as one or more optical media discs, volatile memory components (e.g., DRAM or SRAM), or nonvolatile memory or storage components (e.g., hard drives or solid-state nonvolatile memory components, such as Flash memory components)) and executed on a computer (e.g., any suitable computer or image processor embedded in a device, such as a cell phone, smart phone, PDA, handheld computer, touchscreen tablet computer, laptop computer, media player, entertainment system, or other such computing device). Additionally, any of the intermediate or final data created and used during implementation of the disclosed methods or systems can also be stored on one or more computer-readable media (e.g., non-transitory computer-readable media) and are considered to be within the scope of the disclosed technology. By way of example, computer-readable media include memory 1620 and/or storage 1640. As should be readily understood, the terms computer-readable media and computer-readable storage media do not include propagating signals or signals at communication connections (e.g., 1670), such as modulated data signals.

Any of the computer-executable instructions for implementing the disclosed techniques as well as any data created and used during implementation of the disclosed embodiments can be stored on one or more computer-readable media. The computer-executable instructions can be part of, for example, a dedicated software application or a software application that is accessed or downloaded via a web browser or other software application (such as a remote computing application). Such software can be executed, for example, on a single local computer (e.g., any suitable commercially available computer) or in a network environment (e.g., via the Internet, a wide-area network, a local-area network, a client-server network (such as a cloud computing network), or other such network) using one or more network computers.

For clarity, only certain selected aspects of the software-based implementations are described. Other details that are well known in the art are omitted. For example, it should be understood that the disclosed technology is not limited to any specific computer language or program. For instance, the disclosed technology can be implemented by software written in C++, Java, Perl, JavaScript, Adobe Flash, or any other suitable programming language. Likewise, the disclosed technology is not limited to a particular type of hardware. Certain details of suitable computers and computing hardware are well known and need not be set forth in detail in this disclosure.

Furthermore, any of the software-based embodiments (comprising, for example, computer-executable instructions for causing a computing device to perform any of the disclosed methods) can be uploaded, downloaded, or remotely accessed through a suitable communication means. Such suitable communication means include, for example, the Internet, the World Wide Web, an intranet, software applications, cable (including fiber optic cable), magnetic communications, electromagnetic communications (including RF, microwave, and infrared communications), electronic communications, or other such communication means.

The disclosed methods can also be implemented using specialized computing hardware configured to perform any of the disclosed methods. For example, the disclosed methods can be implemented by an integrated circuit (e.g., an application specific integrated circuit ("ASIC") (such as an ASIC digital signal process unit ("DSP"), a graphics processing unit ("GPU"), or a programmable logic device ("PLD"), such as a field programmable gate array ("FPGA")) specially designed or configured to implement any of the disclosed methods.

In view of the many possible embodiments to which the principles of the disclosed invention may be applied, it should be recognized that the illustrated embodiments are only preferred examples of the invention and should not be taken as limiting the scope of the invention. Rather, the scope of the invention is defined by the following claims and their equivalents. We therefore claim as our invention all that comes within the scope and spirit of these claims and their equivalents.

We claim:

1. A method, comprising:
    receiving a compressed video bitstream comprising a first codeword of compressed digital media data;
    decoding the compressed video bitstream, the decoding comprising decoding the first codeword into a first digital media data value by referencing a codeword table, the codeword table associating the first codeword with the first digital media data value and associating a second codeword with a second digital media data value;
    incrementing a first counter for counting occurrences of the first digital media data value being decoded from the compressed video bitstream during the decoding;
    comparing a value of the first counter with a value of a second counter, the second counter for counting occurrences of a second digital media data value being decoded from the compressed video bitstream during the decoding; and
    changing the codeword table such that the first codeword is associated with the second digital media value and the second codeword is associated with the first digital media value if the value of the first counter and the value of the second counter are equal.

2. The method of claim 1, further comprising periodically reducing the values of the first counter and the second counter.

3. The method of claim 1, wherein the first digital media data value and the second digital media value are syntax element values.

4. The method of claim 1, wherein the second codeword has fewer bits than the first codeword.

5. The method of claim 4, wherein the second codeword is adjacent to the first codeword in the codeword table.

6. The method of claim 1, further comprising maintaining the codeword table in a current state if the value of the first counter is less than the value of the second counter.

7. The method of claim 6, further comprising changing the codeword table such that the first codeword is associated with the second digital media value and the second codeword is associated with the first digital media value if the value of the first counter is greater than the value of the second counter.

8. A decoding system, comprising:
    a memory or storage device storing a program for decoding digital video data into compressed digital video data; and
    a processing unit operable to execute the program, wherein said execution of the program causes the processing unit to:
        decode the compressed video bitstream, the decoding comprising decoding the first codeword into a first digital media data value by referencing a codeword table, the codeword table associating the first codeword with the first digital media data value and associating a second codeword with a second digital media data value;
        increment a first counter for counting occurrences of the first digital media data value being decoded from the compressed video bitstream during the decoding;
        compare a value of the first counter with a value of a second counter, the second counter for counting occurrences of a second digital media data value being decoded from the compressed video bitstream during the decoding; and
        change the codeword table such that the first codeword is associated with the second digital media value and the second codeword is associated with the first digital media value if the value of the first counter and the value of the second counter are equal.

9. An encoding system, comprising:
    a memory or storage device storing a program for encoding digital video data into compressed digital video data;
    a processing unit operable to execute the program, wherein said execution of the program causes the processing unit to:
        encode a first syntax element value associated with the digital video data with a first codeword according to a table that correlates at least the first codeword with the first syntax element value and that correlates a second codeword with a second syntax element value, the first codeword having more bits than the second codeword;
        increment a first counter associated with the first codeword;
        compare a value of the first counter with a value of a second counter, the second counter being associated with the second codeword;
        if the value of the first counter is at least equal to the value of the second counter, swap the second codeword with the first codeword such that the second codeword is associated with the first syntax element value and the first codeword is associated with the second syntax element value; and
        if the value of the first counter is less than the value of the second counter, not swap the second codeword with the first codeword.

10. The system of claim 9, wherein said execution of the program further causes the processing unit to periodically reduce the values of the first counter and the second counter.

11. The system of claim 9, wherein the first syntax element and the second syntax element are syntax elements used with one of coded block pattern processing, coded block flag processing, split table processing, inter prediction direction determination, or reference frame index determination.

12. The system of claim 9, wherein the second codeword has fewer bits than the first codeword, and wherein the second codeword is adjacent to the first codeword in the codeword table.

13. A decoding system, comprising:
a memory or storage device storing a program for decoding digital video data into compressed digital video data;
a processing unit operable to execute the program, wherein said execution of the program causes the processing unit to:
decode a plurality of codewords from a bitstream of compressed video information such that the codewords are replaced by corresponding symbols having associations with the codewords, the associations of the codewords to the corresponding symbols being stored in a table;
increment counters that account for occurrences of each of the symbols being decoded from the bitstream during the decoding;
count a number of symbols from the table that occur in the bitstream; and
periodically reduce but not reset values of the counters in order to prevent the values of the counters from exceeding an overflow limit by reducing the values of the counters when the number of symbols from the table that occur in the bitstream reaches a threshold value.

14. The system of claim 13, wherein the counting of the number of symbols from the table that occur in the bitstream is performed by a sum counter.

15. The system of claim 14, wherein the method further comprises resetting the sum counter when the threshold value has been reached.

16. The system of claim 13, wherein the periodically reducing comprises bit shifting the values stored in the counters by one or more bits.

17. The system of claim 16, wherein the bit shifting comprises bit shifting by exactly one bit.

18. The system of claim 13, wherein the method further comprises swapping a first codeword with a second codeword such that the first codeword is associated with a second symbol previously associated with the second codeword and the second codeword is associated with a first symbol previously associated with the first codeword if a counter associated with the first codeword becomes greater than or equal to a counter associated with the second codeword, the second codeword being shorter than the first codeword.

19. The system of claim 13, wherein the method further comprises swapping a first codeword with a second codeword such that the first codeword is associated with a second symbol previously associated with the second codeword and the second codeword is associated with a first symbol previously associated with the first codeword if a counter associated with the first codeword becomes equal to a counter associated with the second codeword, the second codeword being shorter than the first codeword.

20. The system of claim 13, wherein the threshold value is 32 or less.

* * * * *